US009176199B2

(12) United States Patent
Lechat et al.

(10) Patent No.: US 9,176,199 B2
(45) Date of Patent: Nov. 3, 2015

(54) METHOD AND SYSTEM FOR DETECTING A DEFECT ON THE DC POWER SUPPLY BUS OF A POWER CONVERTER

(71) Applicant: Schneider Toshiba Inverter Europe SAS, Pacy sur Eure (FR)

(72) Inventors: David Lechat, Pacy sur Eure (FR); Yves Laurent Allaert, Vernon (FR)

(73) Assignee: SCHNEIDER TOSHIBA INVERTER EUROPE SAS, Pacy sur Eure (FR)

( * ) Notice: Subject to any disclaimer, the term of this patent is extended or adjusted under 35 U.S.C. 154(b) by 258 days.

(21) Appl. No.: 13/857,585

(22) Filed: Apr. 5, 2013

(65) Prior Publication Data

US 2013/0293258 A1 Nov. 7, 2013

(30) Foreign Application Priority Data

May 3, 2012 (FR) .................................... 12 54072

(51) Int. Cl.

*G01R 31/40* (2014.01)
*H02M 1/32* (2007.01)
*G01R 31/02* (2006.01)
*G01R 31/06* (2006.01)

(52) U.S. Cl.

CPC ................ *G01R 31/40* (2013.01); *H02M 1/32* (2013.01); *G01R 31/028* (2013.01); *G01R 31/06* (2013.01)

(58) Field of Classification Search

CPC ................................ G01R 31/40; H02M 1/32
USPC .................................................... 324/764.01
See application file for complete search history.

(56) References Cited

U.S. PATENT DOCUMENTS 5,313,155 A * 5/1994 Yamamoto et al. ........... 324/143
6,075,378 A * 6/2000 Okamura ................ 324/764.01
7,538,684 B2 * 5/2009 Schnetker ..................... 340/653
7,965,069 B2 * 6/2011 Watanabe et al. ............. 323/284
8,259,426 B2 * 9/2012 Xiao et al. ...................... 361/88
2004/0095784 A1 * 5/2004 Zhou .............................. 363/37

FOREIGN PATENT DOCUMENTS

DE 102 44 765 A1 4/2003
DE 10 2010 030 079 12/2011

OTHER PUBLICATIONS

French Preliminary Search Report issued Feb. 26, 2013, in French Application No. 12 54072, filed May 3, 2012 (with English Translation of Categories of Cited Documents).

* cited by examiner

*Primary Examiner* — Arleen M Vazquez
*Assistant Examiner* — Robert P Alejnikov, Jr.
(74) *Attorney, Agent, or Firm* — Oblon, McClelland, Maier & Neustadt, L.L.P.

(57) ABSTRACT

The invention relates to a method for detecting a defect on the DC power supply bus of a power converter connected to an electrical distribution network (RD). The method comprises steps of:

determination of a mean value ($\overline{V}$) of the voltage (Vbus) of the DC power supply bus of the converter, determination of the ripple ($\tilde{V}pp_{H1}$) of the voltage (Vbus) of the DC power supply bus, monitoring of the variation of the said mean value ($\overline{V}$) with respect to the said ripple ($\tilde{V}pp_{H1}$), determination of a defect on the DC power supply bus as a function of the rate of the said variation, the said defect consisting of an anomaly on the inductor (L1) of the DC power supply bus, a power overload of the power converter, or advanced wear of the bus capacitor (Cbus).

18 Claims, 2 Drawing Sheets

REC Sw L1 10 INV RD RL Cbus Vbus C 11 S 3 $\overline{V}$ $\tilde{V}pp_{H1}$ 4

METHOD AND SYSTEM FOR DETECTING A DEFECT ON THE DC POWER SUPPLY BUS OF A POWER CONVERTER

CROSS-REFERENCE TO RELATED APPLICATION

The present application claims the benefit of the French Application No. 12 54072, filed on May 3, 2012, the entire contents of each of which being incorporated herein by reference.

TECHNICAL FIELD OF THE INVENTION

The present invention pertains to a method for detecting a defect on the DC power supply bus of a power converter.

The invention also pertains to a detection system able to implement the said method.

PRIOR ART

In a known manner, a power converter comprises a DC power supply bus to which a DC voltage is applied. The DC power supply bus comprises two power supply lines. Upstream of the DC power supply bus, the power converter comprises a rectifier module intended to rectify the AC voltage provided by an electrical distribution network and to convert it into a DC voltage applied to the bus. Such a power converter also comprises a bus capacitor connected to the two power supply lines of the bus and intended to maintain the bus voltage at a constant value. Moreover, a power converter can comprise a filtering inductor connected to one, the other or both power supply lines of the DC power supply bus, as well as a precharge circuit, furnished with a precharge relay, and employed when starting the variable speed drive.

Because of the presence of the various components, the DC power supply bus is liable to exhibit certain operating defects. These defects are for example:

- advanced wear of the bus capacitor,
- a short-circuit between the turns of the inductor connected to the DC power supply bus,
- a voltage overload of the DC power supply bus,
- untimely opening of the precharge relay or its non-closure.

Present-day power converters are not protected against these defects and do not comprise any simple means for detecting them.

The aim of the invention is to propose a method and a system for detecting a defect on the DC power supply bus of a power converter. For the detection of defects, the detection system does not require any additional sensor.

DISCLOSURE OF THE INVENTION

This aim is achieved by a method for detecting a defect on the DC power supply bus of a power converter connected to an electrical distribution network, the said power converter comprising a rectifier module connected to the electrical distribution network and intended to convert a voltage provided by the electrical distribution network into a voltage applied to the DC power supply bus, a bus capacitor, an inductor and a precharge circuit connected to the DC power supply bus, the said method comprising steps of:

- determination of a mean value of the voltage of the DC power supply bus,
- determination of the ripple of the voltage of the DC power supply bus,
- monitoring of the variation of the said mean value with respect to the said ripple,
- determination of a defect on the DC power supply bus as a function of the rate of the said variation, the said defect consisting of an anomaly on the inductor of the DC power supply bus, a power overload of the power converter, or advanced wear of the bus capacitor.

According to a particular feature, the monitoring step consists of monitoring a ratio between the ripple of the voltage of the DC power supply bus and the mean value of the voltage of the DC power supply bus.

According to another particular feature, the step of monitoring the ratio consists in comparing the said rate of variation with respect to a first rate and to a second rate.

If the rate of variation of the ratio is greater than the first rate, the determination step consists in determining whether the mean value of the voltage of the DC power supply bus has varied. If the mean value of the voltage of the DC power supply bus has varied, the defect consists of an anomaly on a precharge relay of the precharge circuit. If the mean value of the voltage of the DC power supply bus has not varied, the defect consists of an anomaly on the inductor.

On the other hand, if the rate of variation of the ratio lies between the second rate and the first rate, the determination step consists in determining whether the power provided by the power converter has increased. If the power provided by the power converter has increased, the defect consists of a power overload of the voltage converter. If the power provided by the power converter has not increased, the determination step comprises a step of comparing between a value dependent on the ratio and a limit value. According to the result of the comparison performed, the defect consists of advanced wear of the bus capacitor or a variation of the frequency of the electrical distribution network.

According to the invention, the ripple is preferably measured on the first harmonic of the voltage of the DC power supply bus and between two successive extreme values.

The invention also relates to a system for detecting a defect on the DC power supply bus of a power converter connected to an electrical distribution network, the said power converter comprising a rectifier module connected to the electrical distribution network and intended to convert a voltage provided by the electrical distribution network into a voltage applied to the DC power supply bus, a bus capacitor, an inductor and a precharge circuit connected to the DC power supply bus, the said system comprising:

- first means for determining a mean value of the voltage of the DC power supply bus,
- second means for determining the ripple of the voltage of the DC power supply bus,
- means for monitoring the variation of the said mean value with respect to the said ripple,
- third means for determining a defect on the DC power supply bus as a function of the rate of the said variation, the said defect consisting of an anomaly on the inductor of the DC power supply bus, a power overload of the power converter, or advanced wear of the bus capacitor.

According to a particular feature, the system comprises fourth means for determining a ratio between the ripple of the voltage of the DC power supply bus and the mean value of the voltage of the DC power supply bus.

According to another particular feature, the monitoring means are designed to compare a rate of variation of the ratio with respect to a first rate and to a second rate.

If the rate of variation of the ratio is greater than the first rate, the third determination means are designed to monitor the variation of the mean value of the voltage of the DC power supply bus. If the mean value of the voltage of the DC power supply bus has varied, the defect consists of an anomaly on a precharge relay of the precharge circuit. If the mean value of the voltage of the DC power supply bus has not varied, the defect consists of an anomaly on the inductor.

If the rate of variation of the ratio lies between the second rate and the first rate, the third determination means are designed to monitor the variation of the power provided by the power converter. If the power provided by the power converter has increased, the defect consists of a power overload of the voltage converter. If the power provided by the power converter has not increased, the third determination means are designed to implement a comparison between a value dependent on the ratio and a limit value. According to the result of the comparison performed, the defect consists of advanced wear of the bus capacitor or a variation of the frequency of the electrical distribution network.

According to the invention, the system comprises means for measuring or estimating the internal temperature of the bus capacitor.

BRIEF DESCRIPTION OF THE FIGURES

Other characteristics and advantages will become apparent in the detailed description which follows offered with regard to the appended drawings in which.

DETAILED DESCRIPTION OF AT LEAST ONE EMBODIMENT

The invention relates to a method for detecting a defect on the DC power supply bus of a power converter. This detection method is implemented in a detection system S which is included in the power converter or connected to the latter.

Figure 1:
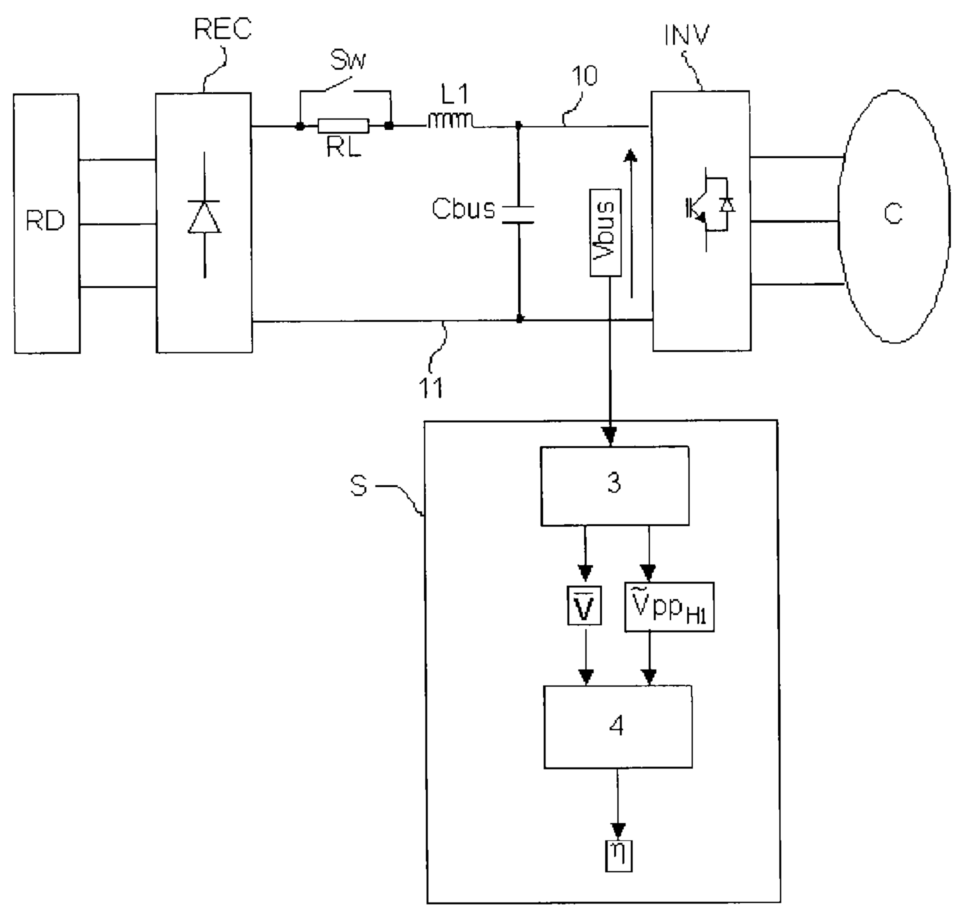
FIG. 1 represents a power converter including the detection system of the invention.

The invention applies to a power converter which comprises:

- a rectifier module REC connected to electrical distribution network RD and intended to convert the AC voltage provided by the network RD into a DC voltage Vbus.
- a DC power supply bus comprising two power supply lines, a first power supply line 10 at positive electrical potential and a second power supply line 11 at negative electrical potential. At the output of the rectifier module REC, the voltage Vbus is applied to the DC power supply bus.
- a bus capacitor Cbus connected to the first power supply line 10 and to the second power supply line 11 of the bus and intended to maintain the voltage Vbus of the DC power supply bus at a constant value. Of course, the expression bus capacitor Cbus is understood to mean also a bank comprising several capacitors connected together.
- at least one filtering inductor L1 connected in series with the first power supply line 10 and/or with the second power supply line 11, upstream of the bus capacitor Cbus.
- a precharge circuit connected in series with the first power supply line 10 (as in FIG. 1) or the second power supply line 11 of the bus or in series with the bus capacitor Cbus. Customarily, this precharge circuit comprises a limiting resistor RL, in parallel with which is mounted a precharge relay Sw. This limiting resistor RL is active on startup during the DC power supply bus charge phase. It makes it possible to limit the input current through the rectifier module REC. Once the bus capacitor Cbus has been charged, the limiting resistor RL is short-circuited by closing the relay Sw mounted in parallel.

Moreover, the invention can also apply to a power converter which comprises an inverter module INV connected downstream of the DC power supply bus and employed to convert the DC voltage Vbus applied to the bus into a variable voltage destined for an electrical load C.

The method of the invention makes it possible to detect a defect occurring on the DC power supply bus of the power converter. This method is implemented in the detection system S, relying solely on the measurement of the voltage Vbus of the DC power supply bus.

The voltage Vbus of the DC power supply bus decomposes into a mean value ($\overline{V}$) and a ripple ($\tilde{V}$) about its mean value.

The voltage Vbus is thus expressed in the following manner:

$$V_{bus}=\overline{V}+\tilde{V}$$

Once continuous conduction has been achieved, if only the first harmonic is considered, the voltage Vbus of the DC power supply bus is:

$$V_{bus}=\overline{V}+\tilde{V}_{H1}*\cos(6\omega_R t)$$

The mean value $\overline{V}$ of the voltage Vbus of the DC power supply bus equals:

$$\overline{V}=\frac{3}{\pi}V_{main}\sqrt{2}\sqrt{3}$$

with $V_{main}$ the simple network voltage.

The first harmonic of the voltage ripple of the bus is:

$$\tilde{V}_{H1}=V_{main}\sqrt{2}\sqrt{3}\frac{6}{35\pi}\frac{1}{\sqrt{\left(1-\left(\frac{6f_R}{f_0}\right)^2\right)^2}}$$

With:

$f_R$ the frequency of the electrical distribution network, $f_0$ the cutoff frequency of a LC filter formed of inductor L1 and bus capacitor Cbus.

According to the invention, it entails observing the variation of the mean value $\overline{V}$ of the voltage Vbus of the DC power supply bus with respect to the ripple $\tilde{V}$ of the voltage Vbus of the DC power supply bus when the power delivered by the power converter is sufficient to allow continuous conduction of the power supply bus. The measurement of the ripple is carried out on the first harmonic and between two successive extreme values ($\tilde{V}pp_{H1}$=voltage peak to voltage peak ripple). This monitoring is thus carried out on the basis of a ratio $\eta$ between the ripple $\tilde{V}pp_{H1}$ of the voltage Vbus of the DC power supply bus and the mean value $\overline{V}$ of the voltage Vbus of the DC power supply bus.

The ratio is thus expressed in the following manner:

$$\eta=\frac{\tilde{V}pp_{H1}}{\overline{V}}$$

In which:

$$\tilde{V}pp_{H1} = \frac{4\overline{V}}{35}\frac{1}{\sqrt{\left(1-\left(\frac{6f_R}{f_0}\right)^2\right)^2}}$$

Since generally $$\frac{6f_R}{f_0} >> 1,$$

it is then possible to make the following approximation:

$$\sqrt{\left(1-\left(\frac{6f_R}{f_0}\right)^2\right)^2} = \left(\frac{6f_R}{f_0}\right)^2$$

i.e.:

$$\tilde{V}pp_{H1} = \frac{4\overline{V}}{35}\frac{1}{\left(\frac{6f_R}{f_0}\right)^2} = \frac{4\overline{V}}{35}\left(\frac{f_0}{6f_R}\right)^2 = \frac{\overline{V}}{35(6\pi f_R)^2 LC}$$

On the basis of the above approximation, the ratio $\eta$ between the ripple of the bus voltage and the mean value of the bus voltage may be written:

$$\frac{\tilde{V}pp_{H1}}{\overline{V}} = \frac{1}{35(6\pi f_R)^2 LC}$$

The ratio $\eta$ can be rewritten in the following form:

$$\frac{\tilde{V}pp_{H1}}{\overline{V}} = k\left(\frac{f_0}{f_R}\right)^2 = \eta$$

At determined or random time intervals, the detection system therefore recovers the measurement of the voltage Vbus of the DC power supply bus and implements means 3 for determining the mean value ($\overline{V}$) of the voltage Vbus of the DC power supply bus and the ripple ($\tilde{V}pp_{H1}$) of the voltage Vbus of the DC power supply bus. Next, the detection system implements means 4 for determining the ratio $\eta$ on the basis of this mean value ($\overline{V}$) of the voltage Vbus of the DC power supply bus and of the corresponding ripple ($\tilde{V}pp_{H1}$) of the voltage Vbus of the DC power supply bus.

Thereafter, the detection system S of the invention implements an algorithm for monitoring the ratio $\eta$ allowing it to detect a possible defect on the DC power supply bus.

In this algorithm, the detection system takes account of the fast or slow increase in the ratio $\eta$. Fast or slow increase in the ratio $\eta$ will be able to be effected by comparison of the rate $V_\eta$ of variation of the ratio with respect to a first rate $v_1$ (corresponding to a variation of at least 10% in less than a second) and to a second rate $v_2$ (corresponding to a variation of 25% over several years), lower than the first rate $v_1$. If the rate $V_\eta$ of increase in the ratio is greater than the first rate $v_1$, the increase will be considered to be fast and if the rate $V_\eta$ of increase in the ratio lies between the second rate $v_2$ and the first rate $v_1$, the increase will be considered to be slow.

Figure 2:
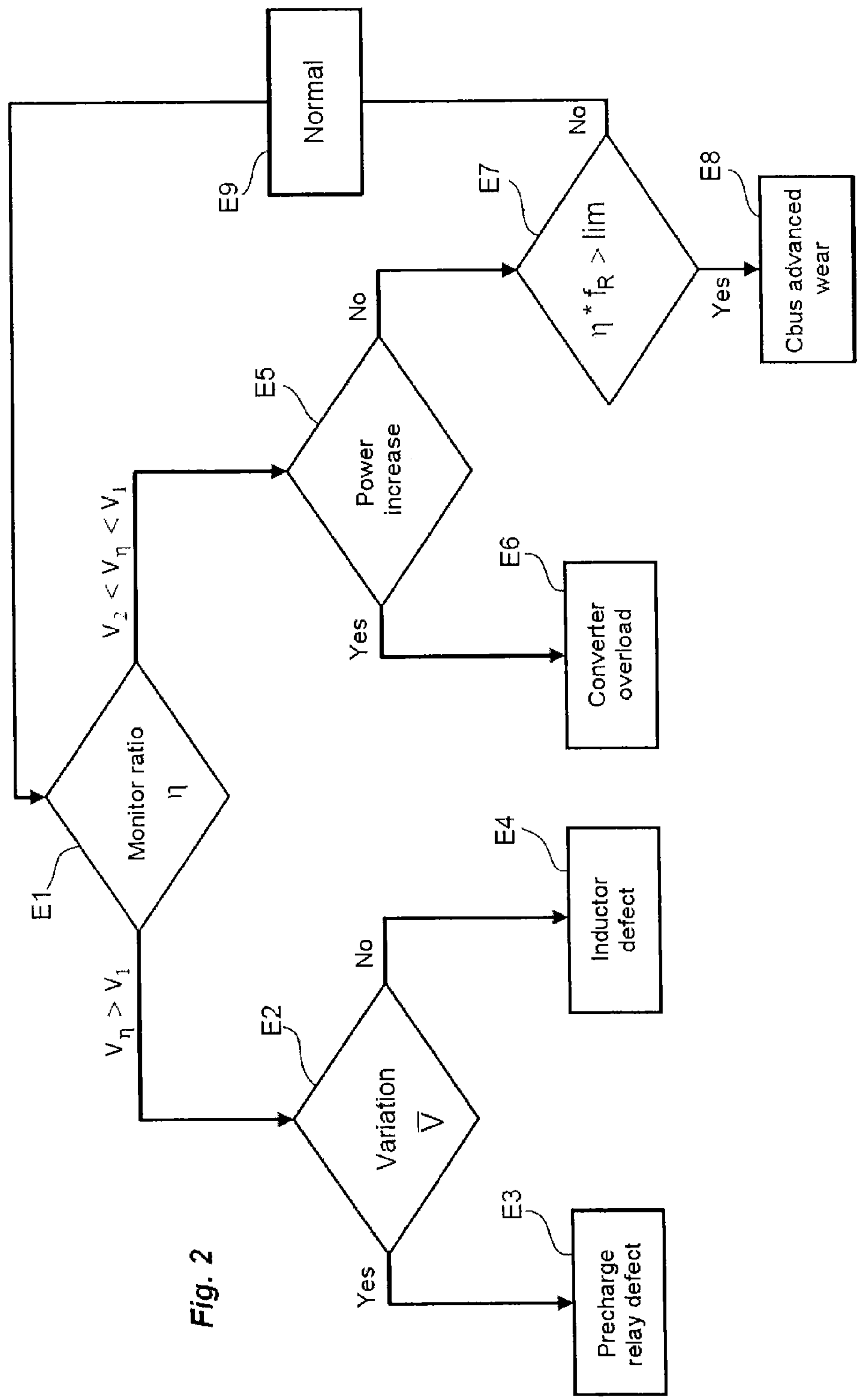
FIG. 2 represents the algorithm implemented in the detection method of the invention.

The detection algorithm is shown diagrammatically in FIG. 2.

In a step E1, the detection system S monitors the ratio $\eta$. If a thermal model of the bus capacitor Cbus is available, the detection system S can refer the ratio $\eta$ to a reference temperature in order to improve the accuracy of measurement of $\eta$.

A fast increase in the ratio $\eta$ during operation of the power converter can have two causes:

- opening of the precharge relay Sw if the converter comprises such a relay,
- short-circuit between several turns of the inductor L1 of the DC power supply bus.

In a step E2, to discriminate these two defects, the detection system S then determines whether this fast increase is related to a variation of the mean value $\overline{V}$ of the voltage Vbus of the DC power supply bus.

If a variation of the mean value $\overline{V}$ of the voltage Vbus of the DC power supply bus accompanies the fast increase in the ratio $\eta$, then the defect certainly originates from the opening of the precharge relay Sw. In a step E3, the detection system S therefore infers a defect on the precharge relay Sw and signals it for example to the operator.

On the other hand, if the fast increase in the ratio $\eta$ is not related to a variation of the mean value $\overline{V}$ of the voltage Vbus of the DC power supply bus, then this signifies that the defect certainly originates from a short-circuit between the turns of the inductor L1. In a step E4, the detection system S therefore infers a defect on the DC power supply bus filtering inductor L1 and signals it for example to the operator.

The detection of these two defects is valid, whatever the position of the precharge circuit, that is to say in series with a power supply line 10, 11 of the DC power supply bus (as in FIG. 1) or in series with the bus capacitor Cbus. In this second case, to be able to determine the nature of the defect, the measurement of the voltage Vbus of the DC power supply bus must not, however, include the voltage across the terminals of the precharge circuit.

With reference to FIG. 2, a slow increase in the ratio $\eta$ during normal operation of the power converter can have three distinct causes:

- voltage overload of the power converter,
- advanced wear of the bus capacitor,
- variation of the frequency of the electrical distribution network.

In the case of slow increase in the ratio $\eta$, the detection system S verifies, in a step E5, the level of the power Pf provided by the power converter. If the power Pf provided by the power converter has increased, then the defect certainly originates from a power overload of the power converter. In a step E6, the detection system S therefore infers a defect related to a power overload of the power converter and signals it for example to the operator.

On the other hand, if the power Pf provided by the power converter has not increased, then the detection system S determines whether the defect is related to advanced wear of the bus capacitor Cbus. Accordingly, in a step E7, the detection system S performs a comparison with respect to a limit value (lim), this limit value being determined on the basis of a reference value $\eta_0$ of the ratio. This reference value $\eta_0$ is for example determined upon first power-up of the converter and stored by the detection system S. Two solutions are then conceivable:

- if the frequency of the network $f_R$ is measured, then the detection system S multiplies the ratio $\eta$ by the frequency $f_R$ of the network RD and compares the result with the product of the reference value $\eta_0$ of the ratio times the frequency $f_R$ of the network. The bus capacitor Cbus will be at the end of its life when the value of the product $\eta*f_R$ is 25% greater than $\eta_0*f_R$.

If the frequency $f_R$ of the network is not measured, then the detection system compares the ratio $\eta$ with the expression $$\eta_0\left(\frac{1+tol}{1-tol}\right)^2$$

where "tol" is the tolerance on the value of the network frequency. The bus capacitor will be at the end of its life when $$\eta \geq \eta_0\left(\frac{1+tol}{1-tol}\right)^2.$$

In step E7 of FIG. 2, the comparison is performed by considering the measurement of the frequency $f_R$ of the network available.

If the frequency of the electrical distribution network is measured, the monitoring of the product $\eta*f_R$ amounts directly to monitoring the inverse of the value of the capacitance of the bus capacitor. Thus, if the detection system has a thermal model of the bus capacitor employing means for measuring or estimating the internal temperature of the bus capacitor, it is possible for it to more accurately evaluate the remaining lifetime of the bus capacitor.

During the comparison performed in step E7, if the detection system S infers that the ratio $\eta$ or the product of the ratio $\eta$ times the frequency $f_R$ of the network is greater than the limit value (lim), then the detection system S infers, in step E8, advanced wear of the bus capacitor Cbus and signals it for example to the operator.

On the other hand, in step E7, if the detection system S infers that the ratio $\eta$ or the product of the ratio $\eta$ times the frequency $f_R$ of the network is not greater than the limit value (lim), then the detection system S infers, in step E9, the absence of defect in the power converter. The slow increase in the ratio $\eta$ was then due merely to a variation of the frequency $f_R$ of the electrical distribution network. The detection system can then resume the monitoring of the ratio in step E1.

The invention claimed is:

1. A method for detecting a defect on a DC power supply bus of a power converter connected to an electrical distribution network (RD), the power converter comprising a rectifier module (REC) connected to the electrical distribution network (RD) and intended to convert a voltage provided by the electrical distribution network (RD) into a voltage (Vbus) applied to the DC power supply bus, a bus capacitor (Cbus), an inductor (L1) and a precharge circuit connected to the DC power supply bus, the method being characterized in that it comprises:

determination of a mean value ($\bar{V}$) of the voltage (Vbus) of the DC power supply bus by circuitry, determination of a ripple ($\tilde{V}pp_{H1}$) of the voltage (Vbus) of the DC power supply bus by the circuitry, monitoring of a variation of the mean value ($\bar{V}$) with respect to the ripple ($\tilde{V}pp_{H1}$) by the circuitry, and determination of a defect on the DC power supply bus, by the circuitry, as a function of a rate of the variation, the defect including an anomaly on the inductor (L1) of the DC power supply bus, a power overload of the power converter, or advanced wear of the bus capacitor (Cbus).

2. The method according to claim 1, characterized in that the monitoring comprises monitoring a ratio ($\eta$) between the ripple ($\tilde{V}pp_{H1}$) of the voltage (Vbus) of the DC power supply bus and the mean value ($\bar{V}$) of the voltage (Vbus) of the DC power supply bus.

3. The method according to claim 2, characterized in that monitoring the ratio ($\eta$) comprises comparing the rate ($V_\eta$) of variation with respect to a first rate ($v_1$) and to a second rate ($v_2$).

4. The method according to claim 3, characterized in that, if the rate ($V_\eta$) of variation of the ratio is greater than the first rate ($v_1$), the determination comprises determining whether the mean value ($\bar{V}$) of the voltage (Vbus) of the DC power supply bus has varied.

5. The method according to claim 4, characterized in that, if the mean value ($\bar{V}$) of the voltage (Vbus) of the DC power supply bus has varied, the defect includes an anomaly on a precharge relay (Sw) of the precharge circuit and in that, if the mean value ($\bar{V}$) of the voltage (Vbus) of the DC power supply bus has not varied, the defect includes an anomaly on the inductor (L1).

6. The method according to claim 3, characterized in that, if the rate ($V_\eta$) of variation of the ratio lies between the second rate ($v_2$) and the first rate ($v_1$), the determination comprises determining whether a power (Pf) provided by the power converter has increased.

7. The method according to claim 6, characterized in that, if the power (Pf) provided by the power converter has increased, the defect includes the power overload of the power converter and in that, if the power provided by the power converter has not increased, the determination comprises comparing between a value dependent on the ratio ($\eta$) and a limit value (lim).

8. The method according to claim 7, characterized in that according to a result of the comparison performed, the defect includes advanced wear of the bus capacitor (Cbus) or a variation of a frequency ($f_R$) of the electrical distribution network (RD).

9. The method according to claim 1, characterized in that the ripple is measured on a first harmonic of the voltage of the DC power supply bus and between two successive extreme values of the voltage.

10. A system for detecting a defect on a DC power supply bus of a power converter connected to an electrical distribution network (RD), the power converter comprising a rectifier module (REC) connected to the electrical distribution network (RD) and intended to convert a voltage provided by the electrical distribution network (RD) into a voltage (Vbus) applied to the DC power supply bus, a bus capacitor (Cbus), an inductor (L1) and a precharge circuit connected to the DC power supply bus, the system being characterized in that it comprises circuitry that:

determines a mean value ($\bar{V}$) of the voltage (Vbus) of the DC power supply bus, determines a ripple ($\tilde{V}pp_{H1}$) of the voltage (Vbus) of the DC power supply bus, monitors a variation of the mean value ($\bar{V}$) with respect to the ripple ($\tilde{V}pp_{H1}$), and determines a defect on the DC power supply bus as a function of a rate of the variation, the defect including an anomaly on the inductor (L1) of the DC power supply bus, a power overload of the power converter, or advanced wear of the bus capacitor (Cbus).

11. The system according to claim 10, characterized in that the circuitry determines a ratio ($\eta$) between the ripple ($\tilde{V}pp_{H1}$) of the voltage (Vbus) of the DC power supply bus and the mean value ($\bar{V}$) of the voltage (Vbus) of the DC power supply bus.

12. The system according to claim 11, characterized in that the circuitry compares a rate ($V_\eta$) of variation with respect to a first rate ($v_1$) and to a second rate ($v_2$).

13. The system according to claim 12, characterized in that, if the rate ($V_\eta$) of variation of the ratio is greater than the first rate ($v_1$), the circuitry monitors the variation of the mean value ($\bar{V}$) of the voltage (Vbus) of the DC power supply bus.

14. The system according to claim 13, characterized in that, if the mean value ($\bar{V}$) of the voltage (Vbus) of the DC power supply bus has varied, the defect includes an anomaly on a precharge relay (Sw) of the precharge circuit and in that, if the mean value ($\bar{V}$) of the voltage (Vbus) of the DC power supply bus has not varied, the defect includes an anomaly on the inductor (L1).

15. The system according to claim 12, characterized in that, if the rate ($V_\eta$) of variation lies between the second rate ($v_2$) and the first rate ($v_1$), the circuitry monitors the variation of a power (Pf) provided by the power converter.

16. The system according to claim 15, characterized in that, if the power (Pf) provided by the power converter has increased, the defect includes the power overload of the power converter and in that, if the power provided by the power converter has not increased, the circuitry implements a comparison between a value dependent on the ratio ($\eta$) and a limit value (lim).

17. The system according to claim 16, characterized in that, according to a result of the comparison performed, the defect includes advanced wear of the bus capacitor (Cbus) or a variation of a frequency ($f_R$) of the electrical distribution network (RD).

18. The system according to claim 10, characterized in that the circuitry measures or estimates an internal temperature of the bus capacitor (Cbus).

* * * * *